United States Patent

Nakata

[15] 3,697,833

[45] Oct. 10, 1972

[54] LIGHT ACTIVATED THYRISTOR

[72] Inventor: Josuke Nakata, Itami, Japan

[73] Assignee: Mitsubishi Denki Kabushiki Kaisha, Tokyo, Japan

[22] Filed: Feb. 18, 1971

[21] Appl. No.: 116,358

[30] Foreign Application Priority Data

Feb. 20, 1970 Japan ......................45/14600

[52] U.S. Cl.......317/235 R, 317/235 N, 317/235 AB, 317/235 AE, 317/235 R

[51] Int. Cl.............................H01l 15/00, H01l 9/12

[58] Field of Search.....317/235 N, 235 AB, 235 AE, 317/235 R

[56] References Cited

UNITED STATES PATENTS 3,476,989 11/1969 Miles........................317/235

3,489,962 1/1970 McIntyre..................317/235

*Primary Examiner*—Martin H. Edlow

*Attorney*—Robert E. Burns and Emmanuel J. Lobato

[57] ABSTRACT

The disclosed thyristor includes an annular N emitter layer disposed on a P base layer to encircle the central portion of the latter. Another N emitter layer is disposed on the exposed surface of the central base portion to form an auxiliary thyristor around which a main thyristor is formed. The auxiliary thyristor responds to light falling upon its emitter layer to be fired. A current flowing through the fired thyristor flows into the annular emitter layer through a gate electrode bridging the auxiliary emitter layer and P base layer to fire the main thyristor.

6 Claims, 3 Drawing Figures

LIGHT ACTIVATED THYRISTOR

BACKGROUND OF THE INVENTION

This invention relates to a thyristor and more particularly to a light activated thyristor suitable for use as a high power converter.

For high power converters including a multiplicity of thyristors serially interconnected it is required to simultaneously fire the individual thyristors, but this is difficult to be accomplished through the utilization of an electric current. Thus it is desirable to provide the so-called light activated thyristors adapted to be fired with the light energy. To this end, there have been already proposed light activated thyristors having the PNPN type four layer structure and including a discharge or cathode electrode disposed on the N type emitter layer formed of one of the outer most layers, the electrode being partly cut away to expose the corresponding portion of the N type emitter layer to which an optical energy is adapted to be applied. In that structure of light activated thyristors, the efficient conversion of the optical energy to the corresponding photocurrent and an increase in sensitivity thereof to light by decreasing the minimum firing current required to fire that portion of the PNPN type structure located below the light receiving surface thereof is inconsistent with the design of causing the thyristor to withstand a high rise rate of a forward current or *di/dt* and rendering both a voltage withstandable by the thyristor and the current capacity of the latter high. In other words, an increase in area of the light receiving surface causes a decrease in area with which the main current flows through the thyristor and an increase in sensitivity, to light of the thyristor causes a great decrease in withstand voltage and particularly in breakover voltage at higher temperatures and so on.

In the prior art type of light activated thyristors, therefore, the requirements for light activated thyristors to be effectively operated by light have been inconsistent with those for increases in both the withstanding of voltages and improved current capacity. As a result, light activated thyristors previously usable for practical purposes have been only in the order of 5 amperes at 200 volts.

SUMMARY OF THE INVENTION

Accordingly it is an object of the invention to provide a new and improved light activated thyristor decreased in minimum firing current, and high in both the withstanding of voltages and current capacity by causing the inconsistent requirements as above described to be compatible.

The invention accomplishes this object by provision of a light activated thyristor comprising a wafer of semiconductive material including a first layer of one type conductivity, a second layer of opposite type conductivity disposed on the first layer to form a P-N junction therebetween, a third layer of one type conductivity disposed on the second layer to form a P-N junction therebetween, and a fourth layer of opposite type conductivity disposed on the third layer to form a P-N junction therebetween, a first electrode disposed in ohmic contact with the surface of the first layer and a second electrode disposed in ohmic contact with the surface of the fourth layer, characterized by a fifth layer disposed on the third layer and separated away from the latter, the fifth layer being identical in conductivity to the fourth layer, and including one portion electrically connected to one portion of the third layer through a low resistance.

The fifth layer may be preferably disposed on the central portion of the third layer.

The fifth layer may be advantageously higher in impurity concentration than the fourth layer.

The fifth layer may be nearer to the second layer than to the fourth layer in order to decrease a current for required to fire an auxiliary thyristor including the fifth layer for a given light input.

A gate electrode may be conveniently disposed in ohmic contact with both one portion of said fifth layer and the adjacent portion of said third layer.

BRIEF DESCRIPTION OF THE DRAWING

The invention will become more readily apparent from the following detailed description taken in conjunction with the accompanying drawing in which.

DESCRIPTION OF THE PREFERRED EMBODIMENTS

Figure 1:
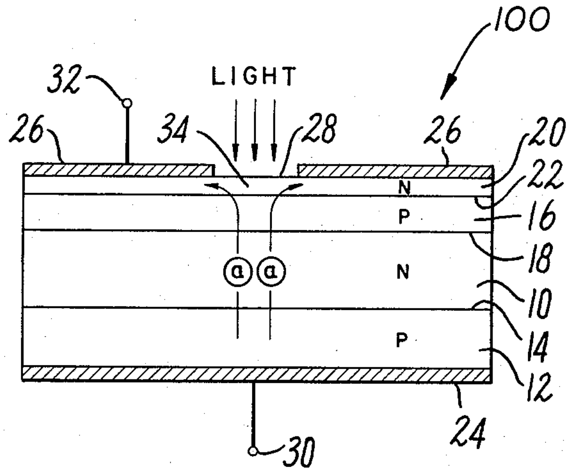
FIG. 1 (PRIOR ART)
FIG. 1 is an elevation view, partly in section, of a light activated thyristor constructed in accordance with the principles of the prior art.

Before the invention will be in detail described, the prior art type of light activated thyristors will be first described with reference to FIG. 1 of the drawing for the purpose of better understanding the invention. In FIG. 1 a typical one of the conventional light activated thyristors generally designated by the reference numeral 100 is shown as being an NPNP type four layer element. The element 100 includes an N type layer 10, a P type emitter layer 12 disposed on one surface of the N type layer 10 to form a P-N junction 14 therebetween, a P type base layer 16 disposed on the other surface of the N type layer 10 to form a P-N junction 18 therebetween, and an N type emitter layer 20 disposed on the P type base layer 16 to form a P-N junction 22 therebetween. Starting with a circular wafer of any suitable semiconductive material such as silicon, the element 100 can be produced into such a four layer structure by any suitable technique well known in the art.

Further the element has a circular metallic electrode 24 disposed in ohmic contact with the exposed surface of the P type emitter layer 12 and an annular metallic electrode 26 disposed in ohmic contact with the exposed surface of the N type emitter layer 20 in the well known manner. The electrode 24 provides one of main electrodes, in this case, an anode electrode while the annular electrode 26 provides the other main electrode or a cathode electrode with the central opening of the cathode electrode serving to form a light receiving surface 28 on the N type emitter layer 20. Then an anode and a cathode terminal 30 and 32 respectively are connected to the anode and cathode electrodes 24 and 26 respectively to complete the light activated thyristor.

Upon irradiating the light receiving surface 28 with a light pulse, the photons incident upon that surface penetrate and collide with the crystal lattice of the semiconductive material, in this case, silicon to form hole-electron pairs in each of the N type emitter layer 20, the P type base layer 16, the N type base layer 10 and the P type emitter layer 12. Thereby a photocurrent flows below the light receiving surface 28. If the magnitude of that photocurrent exceeds a current level at which the thyristor 100 is fired then the latter is fired and put in its conducting state thereby to cause the associated load current to flow through the thyristor 100 between the main electrodes 24 and 26.

In the arrangement of FIG. 1 it is noted that the light receiving surface 28 forms an exposed surface of a light receiving portion or, an N type emitter portion 34 responsive to light incident upon the surface 28 to be initiated to be fired and forming one part of the N type emitter layer 20 contacted by one of the main electrode, in this case, the cathode electrode 26. That is to say, the N type emitter portion and layer 34 and surface 28 are formed of the same layer formed at a time and equal in both thickness and impurity concentration to each other. Therefore, if it is attempted to efficiently convert the optical energy to the photocurrent and to decrease a minimum firing current required to fire that portion of the NPNP element located directly below the light receiving surface 28 then such attempts are inconsistent with the requirements for designing the thyristor so as to withstand a high rise rate of a forward current or *di/dt* and to render the thyristor high in both the withstanding of voltage and current capacity. In other words, an increase in area of the light receiving surface causes a decrease in area with which the main or load current flows through the thyristor and also an increase in sensitivity to light of the thyristor causes a great decrease in withstand voltage and particularly in breakover voltage at high temperatures.

The invention contemplates to eliminate the disadvantages of the prior art type devices such as above described. According to the principles of the invention, the NPNP type element has disposed therein an N type emitter layer responsive to an optical energy incident upon the associated light receiving surface to be fired, and separated away from the N type emitter layer through which the main or load current flows. Thus an auxiliary, light activated thyristor is formed below the light receiving surface in the NPNP element. Especially, the auxiliary thyristor is designed and constructed such that those portions of the P-N junctions included therein efficiently convert an optical energy falling upon the light receiving surface to a photocurrent while a current required to fire it is rendered low and that a current flowing through the thyristor fired with the optical energy is increased enough to be utilized as a gating current for a main thyristor adjacent the auxiliary light activated thyristor. This measure permits the main thyristor to be rapidly fired with a relatively small quantity of an optical energy.

On the other hand, the design of those portions of the P-N junctions included in the main thyristor is emphasized in that unlike those portions of the PN junctions included in the auxiliary thyristor, they are principally high in the ability to withstand voltage and large in area of current conduction.

Figure 2:
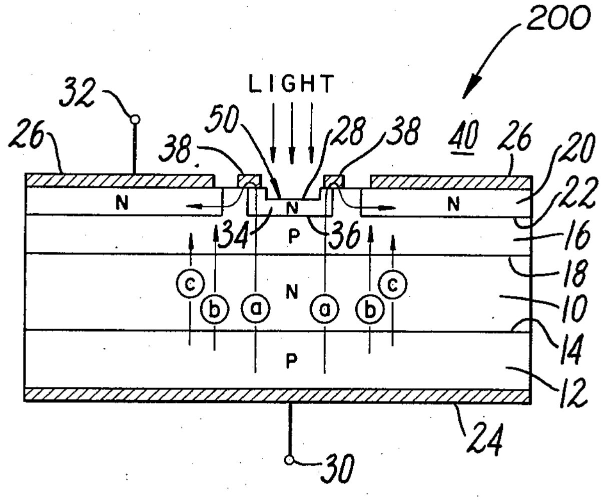
FIG. 2 is an elevation view, partly in section, of a light activated thyristor constructed in accordance with the principles of the invention.

Referring now to FIG. 2, there is illustrated a light activated thyristor constructed in accordance with the principles of the invention. The arrangement generally designated by the reference numeral 200 comprises an N type annular emitter layer 20 encircling the central portion of the P type base layer 16, and an N type, auxiliary emitter layer 34 of U-shaped cross section disposed on the exposed surface of the central portion of the P type base layer 16 to form a P-N junction 36 therebetween and separated away from the N type annular emitter layer 20. The N type emitter layer 34 includes a recessed exposed surface forming the light receiving surface 28. The layer 34 also has one portion thereof electrically connected to one portion of the P type base layer 16. For that purpose a gate electrode 38 of any suitable metallic material is shown in FIG. 2 as being in the form of an annulus disposed in ohmic contact with both layers 16 and 34 so as to bridge them. In other respects the arrangement is identical to that shown in FIG. 1 but it can be considered to include an auxiliary thyristor unit forming that portion of the NPNP type element disposed directly below the receiving surface 28 and a main thyristor unit forming that portion of the NPNP type element encircling the auxiliary thyristor unit only for purpose of illustration. The main and auxiliary thyristor units may be generally designated by the reference numerals 40 and 50 respectively.

The NPNP type element as shown in FIG. 2 can readily be produced by any suitable technique well known in the art and the production thereof need not be described herein. However it is preferable that while the P-N junctions 14 and 18 are common to the main and auxiliary thyristor units 40 and 50 respectively the N type auxiliary emitter layer 34 is thinner than the N type main emitter layer 20 in order to improve the transmission of light through the auxiliary emitter layer. Further, in order to increase a rate at which electrons are injected into the P-N junction 36, the N type auxiliary emitter layer 34 is advantageously higher in impurity concentration than the N type main emitter layer 20 and also than the P type base layer 16 while a ratio of the impurity concentration of the layer 34 to that of the layer 16 is greater than the corresponding ratio between the layers 34 and 20. This can readily be accomplished by using an suitable means well known in the art.

When doing so, the injection efficiency of electrons at the P-N junction 36 increases to increase a current amplification degree of an NPN type transistor formed of the N type auxiliary emitter layer 28, the P type lase layer 16 and the N type base layer 10 providing in this case an N type collector layer. As a result, one can decrease a photocurrent required to fire the auxiliary thyristor unit 50. On the other hand, the main thyristor unit 40 is formed such that the P-N junction 22 included therein is somewhat smaller in injection rate of electrons than P-N junction 36 and that the forward voltage drop across the main thyristor unit 40 is caused to decrease without a great decrease in forward blocking voltage thereof at high temperature.

The arrangement of FIG. 2 is operated as follows: Assuming that the anode terminal 30 is applied with a higher potential than that of the cathode terminal 32 to maintain the light activated thyristor 200 in its forward blocking state, the light receiving surface 28 can be irradiated with laser light from any suitable semiconductor laser diode (not shown) formed, for example of gallium arsenide (GaAs) through a bundle of optical fibers of the conventional constructions as shown at the arrows in FIG. 2. Photons incident upon the light receiving surface 28 penetrate and collide with the crystal lattice of the semiconductive material in this case, silicon to form hole-electron pairs in each of the N type emitter layer 34, the P type base layer 16, the N type base layer 10 and the P type emitter layer 12, resulting in a flow of photocurrent through the auxiliary thyristor unit 50. That photocurrent will exceed a level of firing current whereupon the auxiliary thyristor unit 50 is fired.

At that time the current flows from the N type auxiliary emitter layer 28 of the auxiliary thyristor unit 40 through the annular gate electrode 38 and the central surface portion the P type base layer 16 into the N type main emitter layer 20 of the main thyristor unit 40 as shown at the arrows designated by the reference character *a* thereby to fire the main thyristor unit 40. Then the associated load current spreads in the main thyristor unit 40 as shown at the arrows designated by the reference characters *b* and *c* until it has been complated to be fired. That is, it is put in its conducting state.

Thus the current designated at the arrows *a* has added thereto the main current flowing from the anode side through the silicon to the cathode side, thereby to become much higher than the initial photocurrent. This increased current is used as a gating current for the main thyristor unit 40. Due to the relatively large magnitude thereof, the current serves to much decrease the turn-on time of the main thyristor unit 40.

Therefore it will be appreciated that the arrangement of FIG. 2 is operative to fire the high current capacity thyristor with a relative low light input while decreasing the turn-on time of the main thyristor.

Figure 3:
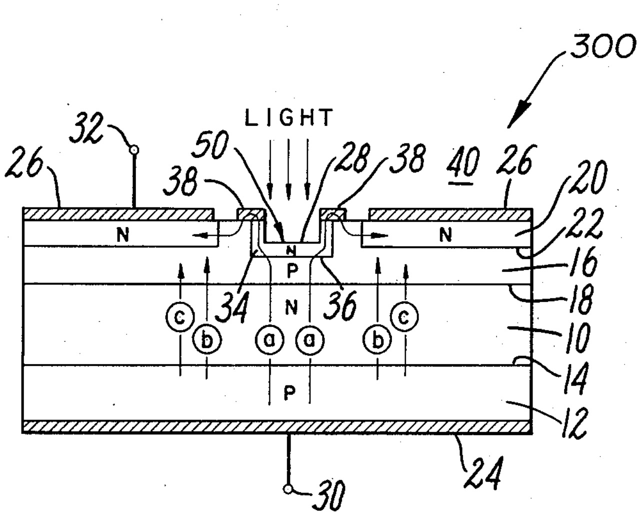
FIG. 3 is a view similar to FIG. 2 but illustrating a modification of the invention. Throughout the FIGURES like reference numerals designate the identical or corresponding components.

An arrangement generally designated by the reference numeral 300 in FIG. 3 is substantially identical to that shown in FIG. 2 excepting that the P-N junction 36 included in the auxiliary thyristor unit 50 is nearer to the P-N junction 18 than to the P-N junction 22. The purpose of the arrangement as shown in FIG. 3 is to decrease the necessary current required to fire the auxiliary thyristor unit 50 for a given light input thereto.

The invention has several advantages. For example, a set of design parameters required for main thyristors to increase both the withstanding of voltage and current capacity can be selected fairly freely and independently of those required for light thyristors because the main and auxiliary thyristor units include their own N type emitter layers separated away from each other. This permits light activated thyristors for handling high voltages to be relatively easily realized. Such thyristors have been previously regarded to be difficult to be manufactured. Also as the gating current for the main thyristor unit becomes high by addition to the firing current for the auxiliary transistor unit of the load current resulting form the conduction of the latter the main thyristor unit is turned "on" quickly and has low losses due to the reduced time in which the on state is reached. Furthermore, the unique advantages exhibited by light activated thyristors is maintained and it avoids troubles associated with the gating circuit, various malfunctions resulting from the insulation and induction of the gating circuit, a time delay etc. Thus a thyristor apparatus including a multiplicity of thyristors as above described interconnected in series circuit relationship are effectively applicable to a variety of fields in industry including direct current transmission.

While the invention has been illustrated and described in conjunction with a few preferred embodiments thereof it is to be noted that numerous changes and modifications may be resorted to without departing from the spirit and scope of the invention. For example, another auxiliary light activated thyristor such as above described may be formed in the four layer element to further increase the photocurrent leading to an increase in gating current for the main thyristor.

Such an auxiliary thyristor may be in the form of an annulus encircling the auxiliary thyristor unit 50 as above described and separated away therefrom.

If desired, a separate gate electrode may be suitably disposed on the four layer element to use as the usual thyristor.

What is claimed is:

1. A light activated thyristor comprising, in combination a wafer of semiconductive material including, a first layer of one type conductivity, a second layer of opposite type conductivity disposed on said first layer to form a first P-N junction therebetween, a third layer of one type conductivity disposed on said second layer to form a second P-N junction therebetween, a fourth layer of opposite type conductivity disposed on said third layer to form a third P-N junction therebetween and a fifth layer of opposite type conductivity disposed on said third layer to form a fourth P-N junction therebetween, said fifth layer having a portion defining an exposed surface providing a light receiving surface, said portion being of lesser thickness than said fourth layer; said third layer having a portion encircling said fifth layer; a gate electrode disposed in ohmic contact with adjacent portions of said fifth and third layers to electrically bridge the latter, a first main electrode disposed in ohmic contact with the surface of said first layer, and a second main electrode disposed in ohmic contact with the surface of said fourth layer.

2. A light activated thyristor as claimed in claim 1 wherein a distance between said second P-N junction and said fourth P-N junction is smaller than that between said second P-N junction and said third P-N junction.

3. A light activated thyristor as claimed in claim 2 wherein said fifth layer is higher in impurity concentration than said fourth layer.

4. A light activated thyristor as claimed in claim 1 wherein said fifth layer is positioned on the central portion of said third layer.

5. A light activated thyristor as claimed in claim 4 wherein a distance between said second P-N junction and said fourth P-N junction is smaller than that between said second P-N junction and said third P-N junction.

6. A light activated thyristor as claimed in claim 5 wherein said fifth layer is higher in impurity concentration than said fourth layer.

* * * * *